(12) United States Patent
Zhang

(10) Patent No.: US 7,994,631 B1
(45) Date of Patent: Aug. 9, 2011

(54) SUBSTRATE FOR AN INTEGRATED CIRCUIT PACKAGE AND A METHOD OF FORMING A SUBSTRATE

(75) Inventor: Leilei Zhang, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 276 days.

(21) Appl. No.: 12/435,361

(22) Filed: May 4, 2009

(51) Int. Cl.
*H01L 23/52* (2006.01)

(52) U.S. Cl. ............... 257/691; 257/698; 257/E23.069; 438/125

(58) Field of Classification Search .................. 257/691, 257/698, E23.069; 438/125
See application file for complete search history.

(56) References Cited

U.S. PATENT DOCUMENTS

| | | | |
|---|---|---|---|
| 7,279,798 B2 * | 10/2007 | Memis | 257/778 |
| 2007/0057363 A1 * | 3/2007 | Nakamura et al. | 257/698 |
| 2009/0178271 A1 * | 7/2009 | Egitto et al. | 29/620 |

OTHER PUBLICATIONS

U.S. Appl. No. 12/129,527, filed May 29, 2008, Wu, Paul, Y., Xilinx, Inc., 2100 Logic Drive, San Jose, CA.

* cited by examiner

*Primary Examiner* — Trung Dang
(74) *Attorney, Agent, or Firm* — John J. King

(57) ABSTRACT

A substrate for an integrated circuit package is disclosed. The substrate comprises a core comprising a first dielectric layer having a first thickness; conductive traces formed on the first dielectric layer for routing signals within the integrated circuit package, wherein the conductive traces have a second thickness; and a substrate support structure comprising conductive traces formed on the first dielectric layer, where the conductive traces of the substrate support structure have a third thickness which is greater than the second thickness. A method of forming an integrated circuit package is also disclosed.

20 Claims, 6 Drawing Sheets

FIG. 9-A
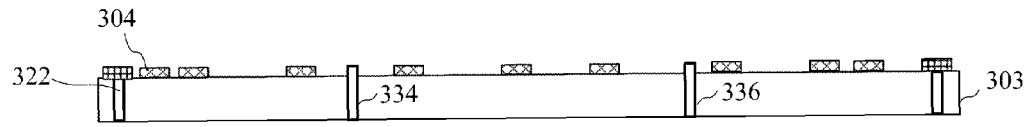
FIG. 9-B
FIG. 9-C
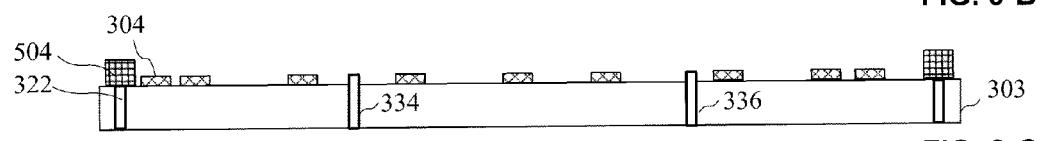
FIG. 9-D
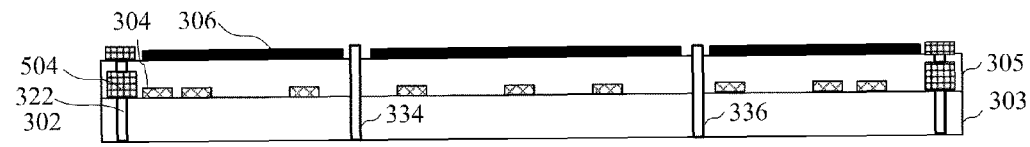
FIG. 9-E
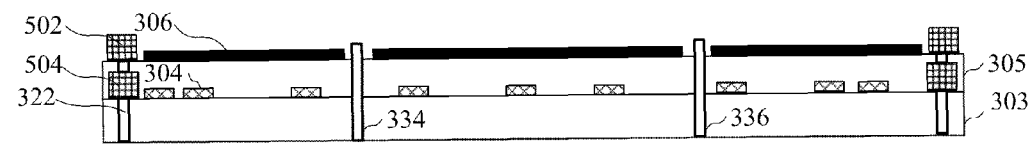
FIG. 9-F
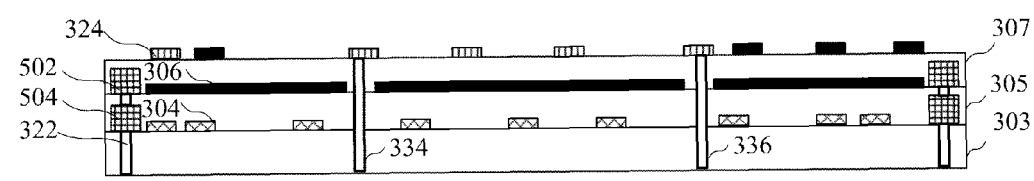
FIG. 9-G
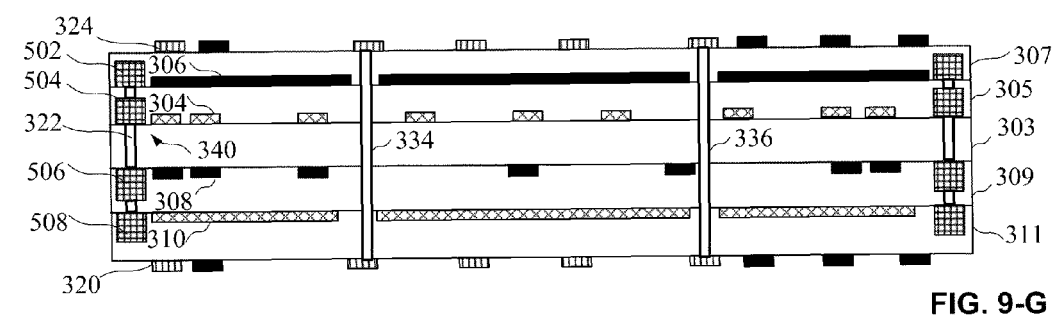

US 7,994,631 B1

SUBSTRATE FOR AN INTEGRATED CIRCUIT PACKAGE AND A METHOD OF FORMING A SUBSTRATE

FIELD OF THE INVENTION

The present invention relates generally to integrated circuits, and in particular, to a substrate for an integrated circuit and a method of forming a substrate for an integrated circuit.

BACKGROUND OF THE INVENTION

When manufacturing a product, it is important that the resulting product is reliable and that little waste is generated in the manufacturing process. When manufacturing integrated circuits, it is important to ensure that the integrated circuits are functioning properly. An integrated circuit may even be discarded if testing of the integrated circuit determines that there are defects which may cause the device to malfunction or fail. Discarding a defective integrated circuit decreases the yield of a batch of wafers used to manufacture the integrated circuits, thereby affecting the overall cost of manufacturing the integrated circuits. Accordingly, there is always an effort in the manufacture of integrated circuits to improve the yield.

With increasing density of silicon technology, a greater number of input/output (I/O) ports are needed for a typical integrated circuit package. This increase in the number of I/O ports requires manufacturing integrated circuits having larger package body sizes. However, as the size of the package increases, there also tends to be an increase in coplanarity, which is the measurement of package warpage. The warpage is typically caused by a coefficient of thermal expansion (CTE) mismatch between a silicon die and a substrate of the integrated circuit package. Excessive warpage may result in the integrated circuit package being discarded, leading to a lower yield in the manufacture of the integrated circuits.

SUMMARY OF THE INVENTION

An embodiment of a substrate for an integrated circuit package is disclosed. In this embodiment, the substrate comprises a core comprising a first dielectric layer having a first thickness; conductive traces formed on the first dielectric layer for coupling signals within the integrated circuit package, wherein the conductive traces have a second thickness; and a substrate support structure comprising conductive traces formed on the first dielectric layer, wherein the conductive traces of the substrate support structure have a third thickness which is greater than the second thickness.

In this embodiment, the conductive traces formed on the first dielectric layer for coupling signals within the integrated circuit package can have a first width, and the conductive traces of the substrate support structure can have a second width, where the first width is less than the second width. The conductive traces of the substrate support structure can extend around the perimeter of the substrate. The core can further comprises a second dielectric layer formed on the first dielectric layer and the substrate support structure, where a second substrate support structure can include conductive traces that are formed on the second dielectric layer. In this embodiment, vias can couple the conductive traces of the substrate support structure and the conductive traces of the second substrate support structure. A thin oxide layer can be over the first dielectric layer, where the thin oxide layer has a fourth thickness which is less than the first thickness. A die can be attached to contact pads formed on the thin oxide layer.

According to another embodiment, a substrate for an integrated circuit package comprises a first dielectric layer of a core, the first dielectric layer having conductive traces coupled to a first reference potential, and a first substrate support structure having conductive traces, where the conductive traces coupled to the first reference potential have a thickness which is less than the conductive traces of the first substrate support structure; a second dielectric layer of the core, the second dielectric layer having conductive traces coupled to a second reference potential, and a second substrate support structure having conductive traces, where the conductive traces coupled to the second reference potential have a thickness which is less than the conductive traces of the second substrate support structure; and vias coupling the conductive traces of the first substrate support structure to the conductive traces of the second substrate support structure.

In this embodiment, the conductive traces of the first substrate support structure can extend around the perimeter of the first dielectric layer of the core and the conductive traces of the second substrate support structure can extend around the perimeter of the second dielectric layer of the core. Support members comprising conductive traces of the first substrate support structure can extend across the first substrate support structure. The widths of the conductive traces of the first substrate support structure can be greater than the widths of the conductive traces coupled to the first reference potential, and the widths of the conductive traces of the second substrate support structure can be greater than the widths of the conductive traces coupled to the second reference potential. The conductive traces of the first substrate support structure and the second substrate support structure can be electrically isolated. The first reference potential can comprise a ground potential, and the second reference potential can comprise a supply voltage. The conductive traces coupled to the first reference potential can comprise a ground plane, and the conductive traces coupled to a second reference potential can comprise a supply voltage plane.

An embodiment of a method of forming a substrate for an integrated circuit package is also disclosed. The method comprises forming a first dielectric layer of a core; forming conductive traces on a first side of the first dielectric layer of the core dielectric, the conductive traces having a first thickness; and forming a substrate support structure on the first side of the first dielectric layer, the substrate support structure comprising conductive traces having a second thickness which is greater than the first thickness.

In this embodiment, a second substrate support structure can be formed on a second side of the first dielectric layer, where the second substrate support structure can comprise conductive traces having the second thickness. The first substrate support structure can be coupled to the second substrate support structure by way of vias extending through the first dielectric layer. Conductive traces can be formed on the second side of the first dielectric layer of the core, where the conductive traces formed on the first side of the first dielectric layer of the core can be coupled to a ground voltage for the integrated circuit package and the conductive traces formed on the second side of the first dielectric layer of the core can be coupled to a supply voltage for the integrated circuit package. A thin dielectric layer can be formed over the first dielectric layer and also contacts on the thin dielectric layer. A die can be attached to the contacts on the thin dielectric layer.

BRIEF DESCRIPTION OF THE DRAWINGS

FIG. 9 is a series of figures showing the formation of the substrate according to an embodiment of the present invention.

DETAILED DESCRIPTION OF THE DRAWINGS

Figure 1:
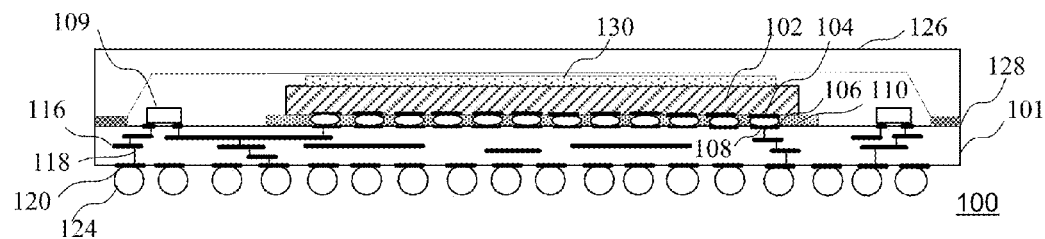
FIG. 1 is an integrated circuit package according to an embodiment the present invention.

FIG. 1 shows a cross-sectional view of an integrated circuit device 100 according to an embodiment the present invention. In particular, a substrate 101 is multi-layer substrate coupled to receive a die 102, such as a silicon die. As is well known in the art, the die 102 is processed to include elements of circuits formed in a silicon substrate of the die and which are coupled to interconnect elements provided by metal layers formed on top of the substrate of the die. A plurality of contact pads 104 on the bottom surface of the die enable circuit elements of the die to be coupled to the substrate by way of solder bumps 106 and contact pads 108 on the substrate. The substrate may also be coupled to receive other discrete elements, such as one or more decoupling capacitors 109. The die may be attached to the substrate by an adhesive 110.

The substrate comprises a plurality of metal layers separated by dielectric layers. As shown in FIG. 1, a conductive trace 116 of a metal layer is coupled by a via 118 to a contact pad 120 of a plurality of contact pads on the bottom of the integrated circuit device. A plurality of solder balls 124 enable the connection of integrated circuit device to another element, such as a printed circuit board having corresponding contacts for receiving the solder balls. Finally, a lid 126 may be attached to the substrate by an adhesive 128 and a thermally conductive adhesive 130 between the lid and the die.

As will be described in more detail below, the metal layers may comprise conductive traces for routing signals or may be reference planes comprising a ground plane coupled to a ground voltage or power plane coupled to a fixed voltage for providing a reference signal. Vias may also extend from the conductive traces through the dielectric layers to another conductive trace or a reference plane. In some cases, vias may extend through multiple dielectric layers, where a via may be positioned between signal traces on metal layers having signal traces, or extend through a "through hole" of a reference plane.

Figure 2:
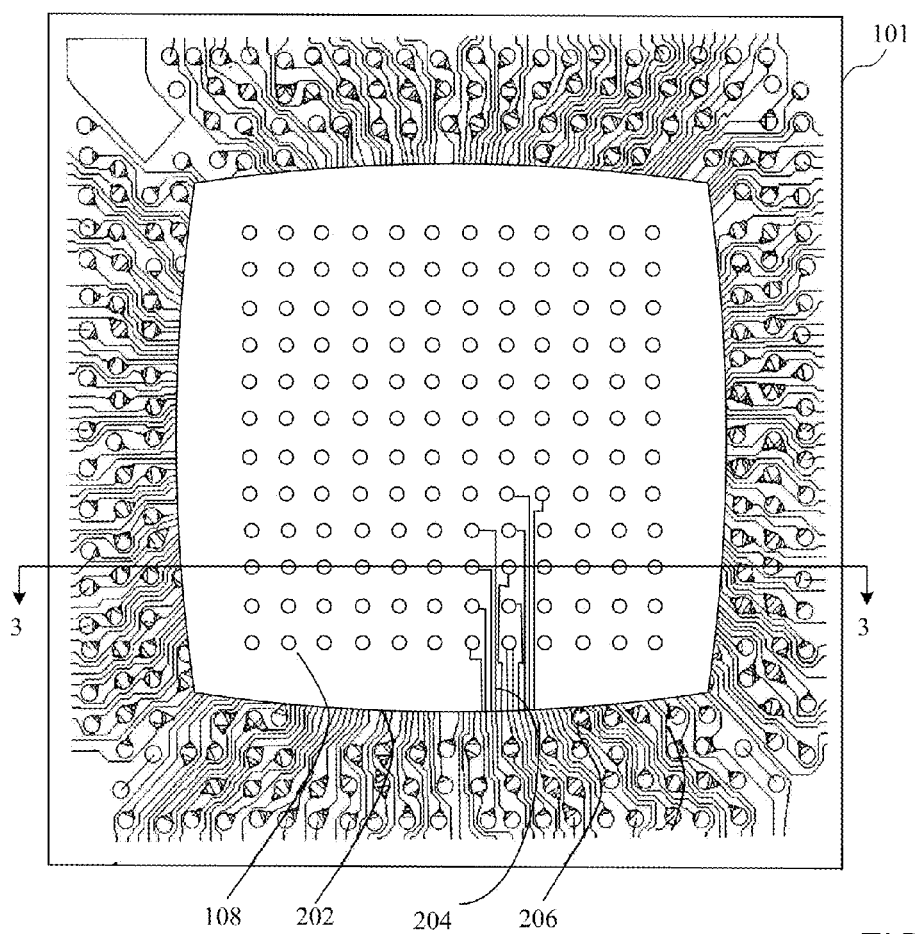
FIG. 2 is a top plan view of the substrate 101 of the integrated circuit package of FIG. 1 according to an embodiment of the present invention.

Turning now to FIG. 2, a top plan view of the substrate 101 of the integrated circuit package of FIG. 1 according to an embodiment of the present invention is shown. A region 202 comprises the contact pads 108 for receiving solder bumps of the die. A plurality of conductive traces 204 on the top surface of the substrate 101 are coupled to vias 206 which provide a connection from the conductive traces 204 to conductive traces associated with other metal layers of the integrated circuit device. The vias 206 provide connections to the solder balls for the integrated circuit package. As will be described in more detail below, conductive traces and vias will be selectively positioned to improve the stiffness of the core of the substrate and reduce the warping of the integrated circuit package.

Figure 3:
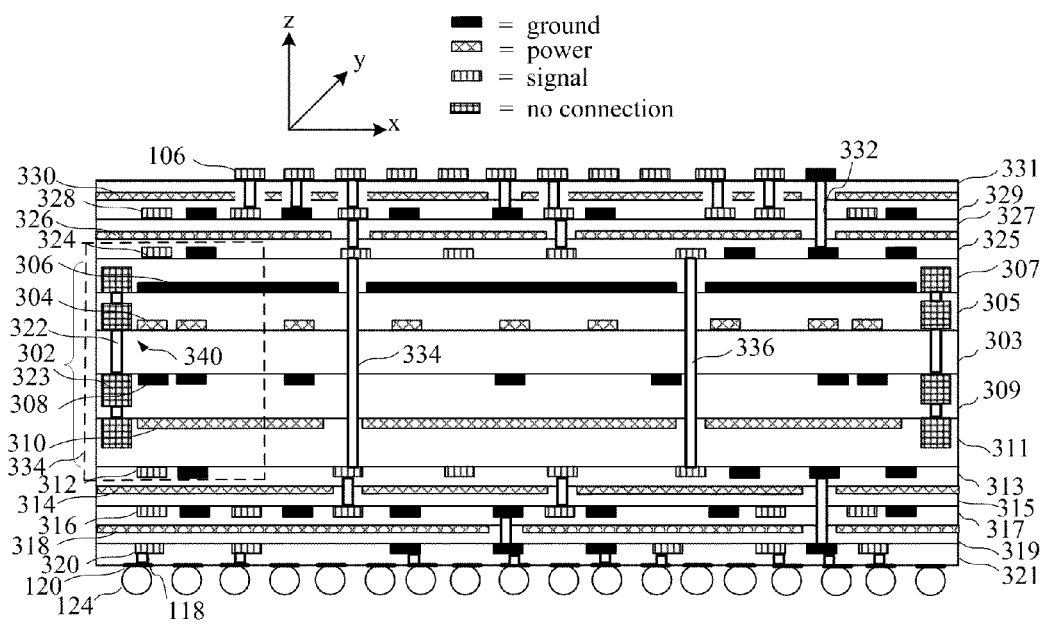
FIG. 3 is a cross-sectional view of the substrate of FIG. 2 taken at lines 3-3 according to an embodiment of the present invention.

Turning now to FIG. 3, a cross-sectional view of the substrate of FIG. 2 taken at lines 3-3 according to an embodiment of the present invention is shown. As shown in FIG. 3, a number of alternating metal layers and insulating layers form the substrate of the integrated circuit package. A core 302 of the substrate comprises a core dielectric having metal layers, where one or more dielectric layers of the core dielectric have a significantly greater thickness than other layers, and therefore provide greater strength for the substrate. However, as will be described in more detail below, the core comprises a layer upon which other layers are built, and may have the same thickness as the other layers. Also, the core may comprise conductive traces for any type of signal, which may include power and/or ground signals. According to the embodiment of FIG. 3, metal layers are applied to a thick dielectric layer 303, where a first metal layer 304 comprising power traces is applied on a first side. A dielectric layer 305 is applied over the metal layer 304, upon which a metal layer 306 comprising ground traces and another dielectric layer 307 are applied. A metal layer 308 comprising ground conductors is provided on a second side of the dielectric layer 303. A dielectric layer 309 is also formed on the metal layer 308, upon which another metal layer 310 comprising power traces is formed. A dielectric layer 311 is applied on the metal layer 310, upon which a metal layer 312 is applied. The metal layer 312 also comprises alternating conductive traces coupling input/output signals and a ground signal. A metal layer 314 and a dielectric layer 315 are applied to the dielectric layer 313. After a dielectric layer 317 is applied over a metal layer 316, another metal layer 318 comprising power traces is applied. Finally, a dielectric layer 319 and a metal layer 320 having a pattern of alternating conductive traces coupling input/output signals and a ground signal is applied. A protective layer 321, such as a dielectric layer, is applied to the metal layer 320 for receiving the contact pads 120. One or more conductive vias 322 may extend between conductive traces on two metal layers comprising layers of the substrate support structure. According to the embodiment of FIG. 3, vias of the substrate support structure extend between each of the layers having conductive traces of the support structure.

Layers are then applied to the opposite side of the thick dielectric layer 303. In particular, another metal layer 324 is applied, comprising alternating conductive traces coupling input/output signals and a ground signal, and upon this layer, a dielectric layer 325 is applied. Another metal layer 326 comprising a power plane is applied. A dielectric layer 327 and a metal layer 328 having alternating conductive traces coupling input/output signals and a ground signal is applied. A dielectric layer 329 may also be applied to the metal layer 328. A power plane 330 may then be applied on the dielectric layer 329, and a dielectric layer 331 is applied on the power plane 330. The contact pads 106 for receiving the die are applied on the dielectric layer 331. Vias 332 are formed during the production of the substrate to enable communication of signals from the contact pads to other layers of the substrate. Vias 334 and 336 extend through the core to provide connections between traces above and below the core.

As can be seen in FIG. 3, the traces in different metal layers extend in different directions. For example, the traces in the ground layer of metal layer 306 and in the power layer of metal layer 310 extend in the x-direction, while traces for the power layer of metal layer 304 and traces for the ground layer of metal layer 308 extend in the y-direction. While only power and ground traces are shown in the core 302 of FIG. 3, signal traces may be implemented in those layers, including signal traces along with power and ground traces. While the core is shown with one or more thick dielectric layers, it should be understood that the dielectric layers of the core could have the same thickness as the other layers, or at least thick enough in view of the thickness of the metal traces over which the dielectric layer is applied.

According to one aspect of the embodiment of FIG. 3, a scaffolding structure comprising a substrate support structure 340 having a configuration of interconnected traces. The substrate support structure 340 may be implemented in a plurality of layers and may have vias which connect two or more of the layers. As will be described in more detail below, the substrate support structure is configured to reduce warping of the substrate. Because the core layers mainly comprise power and ground traces which do not have a requirement for finer lines required to increase density or spacing requirements to minimize cross talk in signal traces, thick copper layers may be applied for the power and ground traces. The scaffolding structure utilizes traces and vias formed with the core power and ground traces to create a mechanical scaffolding structure to improve substrate stiffness. The scaffolding structure may include elements which are not electrically connected to power, ground or signal traces, and therefore are electrically isolated. As will be described in more detail in reference to the top plan view of FIG. 4, the elements of the scaffolding structure comprise interconnect elements extending around the perimeter of the substrate for each of the layers of the core. The interconnect elements of different layers are also preferably connected by vias to form an interlocked, 3-dimensional structure, further minimizing the warping. The formation of the scaffolding structure will be described in more detail in reference to FIG. 9.

The thicknesses of the metal layers and dielectric layers may vary depending upon a number of considerations, including the dimensions of the integrated circuit package, the process used to manufacture the integrated circuit package, cost considerations, and testing results. However, thick dielectric layers may have a thickness of approximately 800 micrometers (μm) and be within a range of approximately 100 μm to 1000 μm, while the thin dielectric layers may be approximately 30 μm and be within a range of approximately 25 μm to 60 μm. The metal layers may have a thickness of approximately 15 μm and be within a range of approximately 10 μm to 30 μm. According to one embodiment, the metal traces forming the substrate support structures may approximately twice the thickness of the other traces, or approximately 30 μm.

Figure 4:
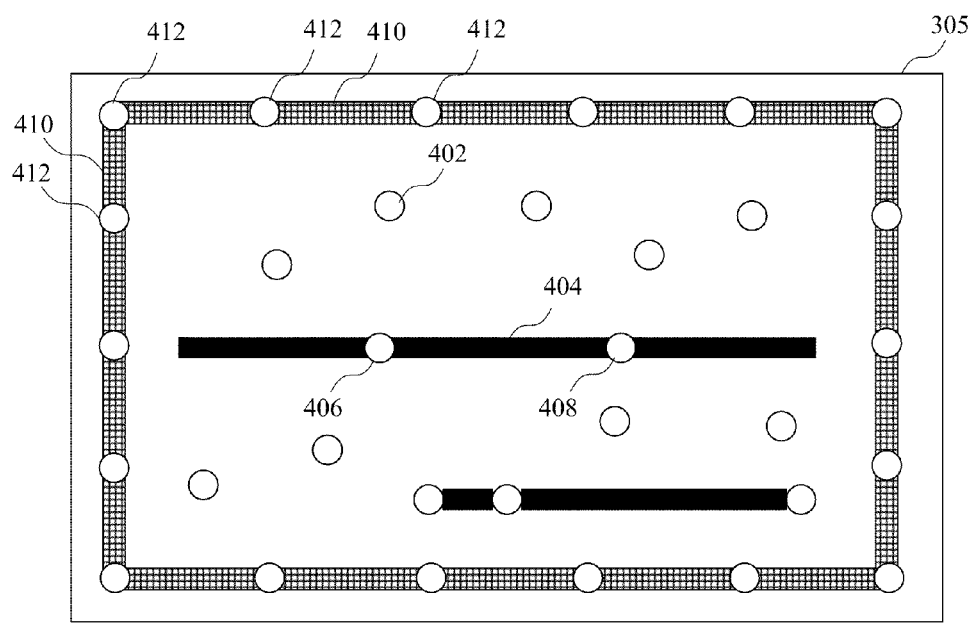
FIG. 4 is a top plan view of a core of the substrate at layer 305 of FIG. 3 according to an embodiment of the present invention.

Turning now to FIG. 4, a top plan view of the core at layer 305 of FIG. 3 according to an embodiment of the present invention is shown. According to the embodiment of FIG. 4, in addition to vias 402 extending through the dielectric layer 305, and ground traces 404 coupled between ground vias 406 and 408, scaffolding traces 410 are coupled to scaffolding vias 412. As shown in FIG. 4, the traces extend between equally spaced scaffolding vias around the perimeter of the structure. As can be seen in FIG. 3, vias couple the traces in a plurality of layers to form the scaffolding structure. All of the vias may be aligned as shown for example in FIG. 3, or may be offset in various layers. The scaffolding traces and scaffolding vias may have no connection to any power, ground, signal trace or via, and therefore may be electrically isolated. Alternatively, the scaffolding structure may be used to couple a power or ground signal within the substrate.

Figure 5:
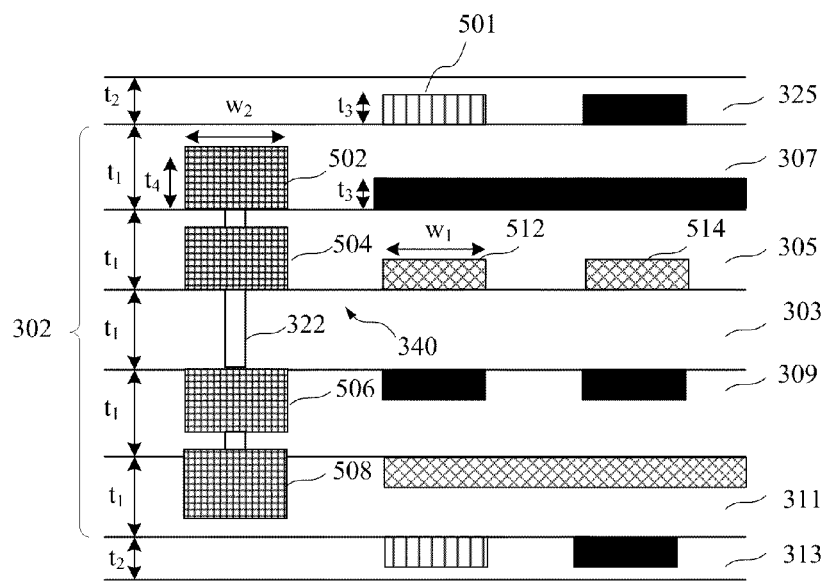
FIG. 5 is an enlarged view of the core of the substrate shown in dashed lines in FIG. 3 according to an embodiment of the present invention.

Turning now to FIG. 5, an enlarged view of a portion of the substrate shown in dashed lines in FIG. 3 is provided. In particular, the thickness $t_1$ of the dielectric layers 303, 305, 307 and 309 of the core 302 is greater than the thickness $t_2$ of the dielectric layers above and below the core 302. Also, the thickness $t_3$ of the traces in dielectric layers above and below the core 302, such as trace 501 above the core, will be less than the thickness $t_4$ of each of the scaffolding traces 502-508 of the scaffolding structure in the core. Because the width $w_1$ may need to meet a certain design specification or may be generally narrower to reduce the amount of copper used, the width $w_1$ of the power and ground signal traces will generally be less than the width $w_2$ of the traces of the scaffolding structure. Further, while the thicknesses of the traces of the power and ground traces in the core may have the thickness $t_3$ to enable closer routing of these traces, they may also be implemented to have the thickness $t_4$ to reduce warpage of the core. However, maintaining the reduced thickness of the power and ground traces in the core will minimize the amount of material such as copper required to create the metal layers of the core, while still providing a scaffolding structure to reduce warpage. While each layer preferably has the same traces around the perimeter of the substrate, where the traces are connected by vias extending vertically from the traces on the top metal layer of the core to the traces on the bottom metal layer of the core, the traces and vias on the scaffolding structure may vary between different metal layers of the core. While copper comprises one material which may be used in the scaffolding structure, a conductive material other than copper may be used.

Figure 6:
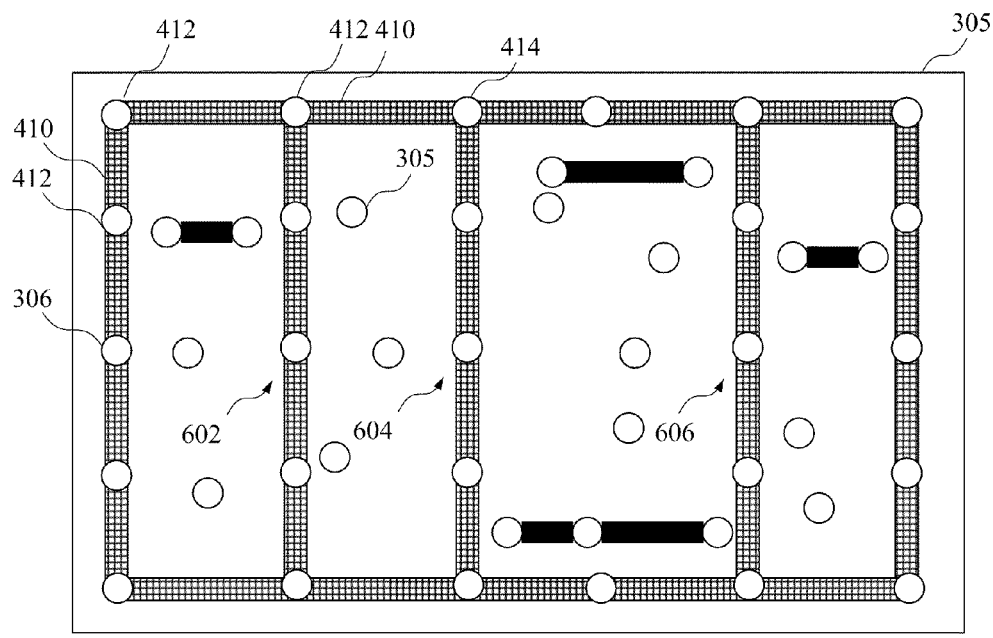
FIG. 6 is a top plan view of the core of the substrate at layer 305 of FIG. 3 according to an alternate embodiment of the present invention.

Turning now to FIG. 6, a top plan view of the core at layer 305 of FIG. 3 according to an alternate embodiment of the present invention is shown. According to the embodiment of FIG. 6, cross members 602, 604 and 606 are provided in the scaffolding. That is, in addition to the traces and vias around the perimeter of the substrate as shown in FIG. 4, additional traces and vias may be coupled to the traces and vias around the perimeter to provide additional support for the scaffolding structure. While FIG. 6 shows the arrangement of traces and vias for layer 305, other dielectric layers may have the same or different configuration of cross members, or may not have any cross members. Although the cross members are shown extending between the top and bottom of the substrate as shown, they may also extend across the substrate from one side to another to form a matrix arrangement. Although the cross members are shown extending across the entire substrate, the cross member may also extend across a portion of the substrate.

Figure 7:
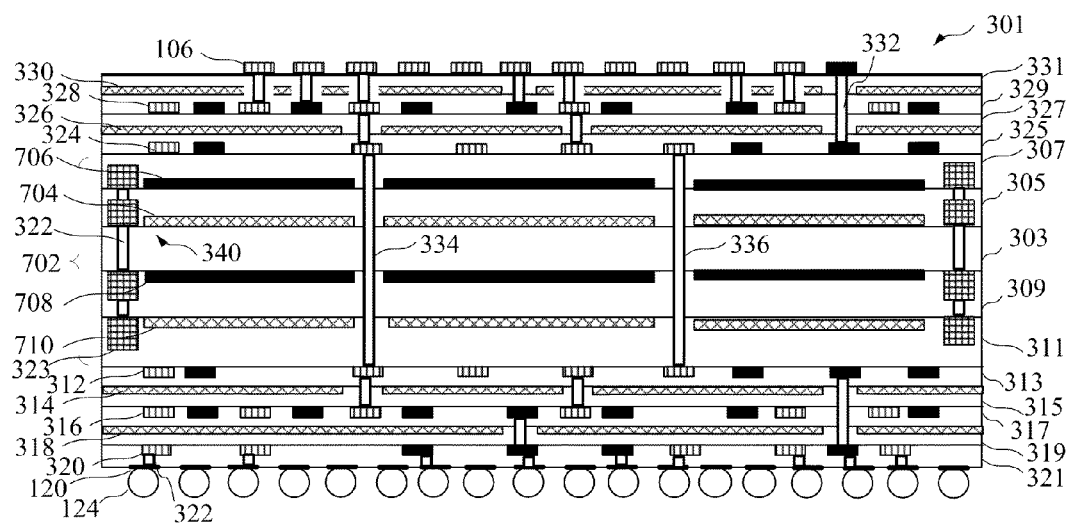
FIG. 7 is a cross-sectional view of the substrate of FIG. 2 having planes taken at lines 3-3 according to an alternate embodiment of the present invention.
Figure 8:
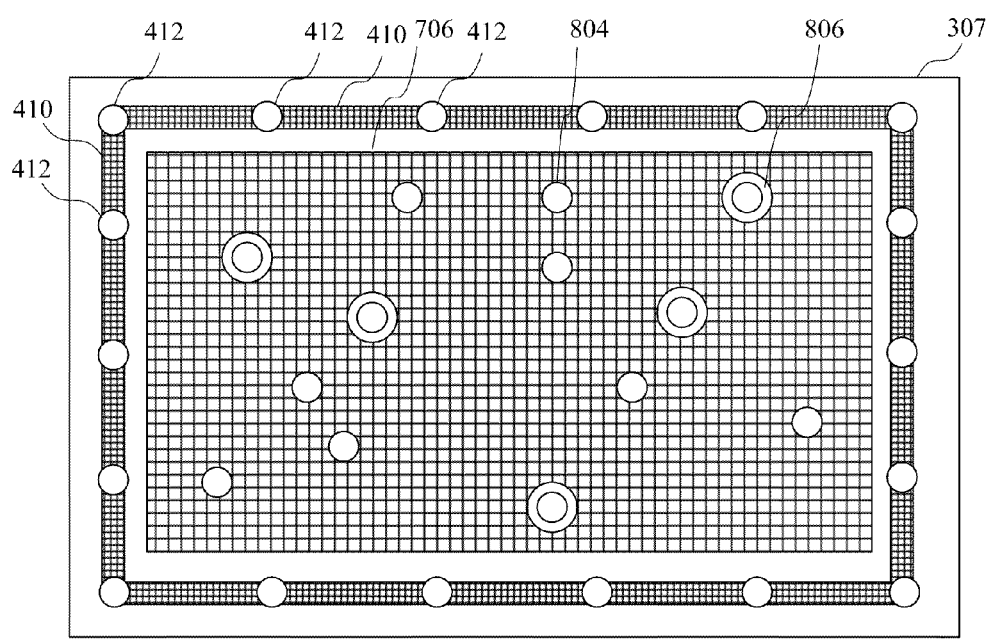
FIG. 8 is a top plan view of the core of the substrate at layer 305 of the substrate of FIG. 7 according to an embodiment of the present invention.

Turning now to FIG. 7, a cross-sectional view of the substrate having power and ground planes in the core according to an alternate embodiment of the present invention is shown. According to the embodiment of FIG. 7, metal layers comprising ground and power layers in the core comprise planes. For example, a core 702 may comprise a power plane 704, a ground plane 706, a ground plane 708 and a power plane 710. As shown in the top plan view of the core of the substrate at layer 305 in FIG. 8, the ground plane 706 comprises ground vias 804 extending through the ground plane, and signal or power vias 806 extending through the ground plane without making contact to the ground plane as shown.

Turning now to FIG. 9, a series of figures shows the formation of a substrate having a scaffolding structure according to an embodiment of the present invention. The thick oxide layer 303 is formed, as shown in a FIG. 9-A, where vias such as vias 324, 334 and 336 are formed through the oxide layer. As can be seen in FIG. 9 B, a first mask is used to form the traces 304, the vias 324, 334 and 336 and a portion of the traces for the scaffolding structure. If the traces 304 are thinner than the traces of the scaffolding structure for purposes of reducing the amount of copper used to create the metal layers of the dielectric core, a second mask would be used to create the traces of the scaffolding structure having the increased thickness, as shown in a FIG. 9-C. After the dielectric layer 305 is applied, a first mask is used to create the metal layer 306 including portions of the scaffolding structure, as shown in a FIG. 9-D. The complete traces for the scaffolding structure formed after a second mask is used are shown in a FIG. 9-E. After dielectric layer 307 and traces of the metal layer 324 are applied as shown in a FIG. 9-F, the various metal layers including the portion of the scaffolding structure are similarly formed on the opposite side of the dielectric layer 303, as shown in a FIG. 9-G. Additional layers may be added to the substrate shown in FIG. 9G to form a complete substrate, such as the substrate shown in FIG. 3. While FIG. 9 shows the embodiment having traces of the scaffolding structure and the other traces in the core having certain dimensions, the dimensions of the traces of the scaffolding structure and other traces may vary as described above.

Figure 10:
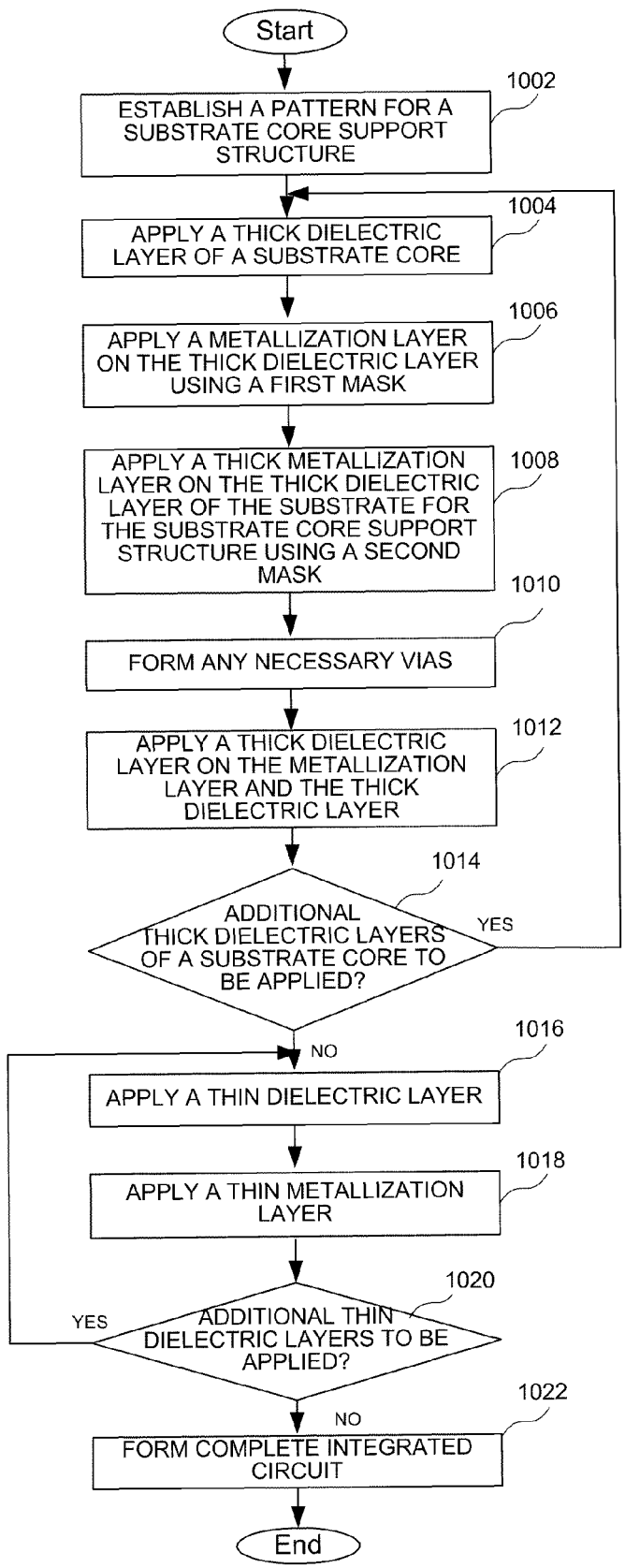
FIG. 10 is a flow chart showing a method of forming a substrate for an integrated circuit package according to an embodiment the present invention.

Finally, turning to FIG. 10, a flow chart shows a method of forming a substrate for an integrated circuit package according to an embodiment the present invention. A pattern for a substrate core support structure is established at a step 1002. A thick dielectric layer of a substrate core is applied at a step 1004. A metallization layer is applied on the thick dielectric layer using a first mask at a step 1006. A thick metallization layer is then applied on the thick dielectric layer of the substrate for the substrate core support structure using a second mask at a step 1008. That is, the second metalization layer enables the support structure to have an increased thickness as described above. Any necessary vias are then formed at a step 1010. A thick dielectric layer is then applied on the metallization layer and the thick dielectric layer at a step 1012. It is then determined whether additional thick dielectric layers of a substrate core and any elements of the substrate support structure are to be applied at a step 1014. If yes, then proceed back to step 1004 where a thick dielectric layer is applied to the substrate core. If not, a thin dielectric layer is applied at a step 1016, followed by a thin metallization layer applied at a step 1018. It is then determined whether additional thin dielectric layers are to be applied at a step 1020. If yes, then proceed back to step 1016 where a thin dielectric layer is applied. Otherwise, if no, then a complete integrated circuit is formed at a step 1022. For example, the remaining elements necessary to form a complete integrated circuit as shown in FIG. 1 are added to the substrate. According to an alternate embodiment, rather than applying a second metal layer to create thicker conductive traces for the substrate support structure, a thick metal layer may be applied on the entire layer with a subtractive process, such at etching, being used to create the thinner metal portions on the layers having the substrate support structure. The method of FIG. 10 may be implemented to produce an integrated circuit package as described above in FIGS. 1-9, or some other suitable integrated circuit package.

The circuit and methods of the present invention provide a low cost package having improved coplanarity without significantly altering the manufacturing process. Coplanarity of integrated circuit packages was evaluated using a scaffolding structure as set forth above. For devices having a die size of 19.3 millimeters (mm) by 15.3 mm and a package size of 35 mm by 35 mm, the average coplanarity was determined to be 2.97 mm with maximum and minimum coplanarity being 1.84 mm and 4.54 mm respectively, compared with conventional devices having an average coplanarity of 3.52 mm with maximum and minimum coplanarity being 2.15 mm and 4.44 mm respectively. As can be seen, the implementation of the substrate support structure reduces the average coplanarity of the integrated circuit packages.

It can therefore be appreciated that the new and novel substrate for an integrated circuit package and a method of forming a substrate for an integrated circuit package has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A substrate for an integrated circuit package, the substrate comprising:
   a core comprising a first dielectric layer having a first thickness;
   a plurality of conductive traces formed on the first dielectric layer for routing signals within the integrated circuit package, wherein the plurality of conductive traces have a second thickness; and
   a substrate support structure comprising a plurality of conductive traces formed on the first dielectric layer, wherein the plurality of conductive traces of the substrate support structure have a third thickness which is greater than the second thickness.

2. The substrate of claim 1 wherein the plurality of conductive traces formed on the first dielectric layer for coupling signals within the integrated circuit package have a first width and the plurality of conductive traces of the substrate support structure have a second width, wherein the first width is less than the second width.

3. The substrate of claim 1 wherein the plurality of conductive traces of the substrate support structure extend around the perimeter of the substrate.

4. The substrate of claim 1 wherein the core further comprises a second dielectric layer formed on the first dielectric layer and the substrate support structure, wherein a second substrate support structure comprising a plurality of conductive traces is formed on the second dielectric layer.

5. The substrate of claim 4 further comprising a plurality of vias coupling the plurality of conductive traces of the substrate support structure and the plurality of conductive traces of the second substrate support structure.

6. The substrate of claim 1 further comprising a thin oxide layer over the first dielectric layer, the thin oxide layer has a fourth thickness which is less than the first thickness.

7. The substrate of claim 6 further comprising a die attached to contact pads formed on the thin oxide layer.

8. A substrate for an integrated circuit package, the substrate comprising:
   a first dielectric layer of a core, the first dielectric layer having a plurality of conductive traces coupled to a first reference potential, and a first substrate support structure having a plurality of conductive traces, wherein the plurality of conductive traces coupled to the first reference potential have a thickness which is less than the plurality of conductive traces of the first substrate support structure;

a second dielectric layer of the core, the second dielectric layer having a plurality of conductive traces coupled to a second reference potential, and a second substrate support structure having a plurality of conductive traces, wherein the plurality of conductive traces coupled to the second reference potential have a thickness which is less than the plurality of conductive traces of the second substrate support structure; and a plurality of vias coupling the plurality of conductive traces of the first substrate support structure to the plurality of conductive traces of the second substrate support structure.

9. The substrate of claim 8 wherein the plurality of conductive traces of the first substrate support structure extends around the perimeter of the first dielectric layer of the core, and the plurality of conductive traces of the second substrate support structure extends around the perimeter of the second dielectric layer of the core.

10. The substrate of claim 9 further comprising a plurality of support members comprising the plurality of conductive traces of the first substrate support structure extending across the first substrate support structure.

11. The substrate of claim 8 wherein widths of the plurality of conductive traces of the first substrate support structure are greater than widths of the plurality of conductive traces coupled to the first reference potential and the widths of the plurality of conductive traces of the second substrate support structure are greater than the widths of the plurality of conductive traces coupled to the second reference potential.

12. The substrate of claim 8 wherein the plurality of conductive traces of the first substrate support structure and the second substrate support structure are electrically isolated.

13. The substrate of claim 8 wherein the first reference potential comprises a ground potential and the second reference potential comprises a supply voltage.

14. The substrate of claim 8 wherein the plurality of conductive traces coupled to the first reference potential comprises a ground plane and the plurality of conductive traces coupled to a second reference potential comprises a supply voltage plane.

15. A method of forming a substrate for an integrated circuit package, the method comprising:
   forming a first dielectric layer of a core;
   forming a plurality of conductive traces on a first side of the first dielectric layer of the core dielectric, the plurality of conductive traces having a first thickness; and
   forming a substrate support structure on the first side of the first dielectric layer, the substrate support structure comprising a plurality of conductive traces having a second thickness which is greater than the first thickness.

16. The method of claim 15 further comprising forming a second substrate support structure on a second side of the first dielectric layer, the second substrate support structure comprising a plurality of conductive traces having the second thickness.

17. The method of claim 16 further comprising coupling the first substrate support structure to the second substrate support structure by way of vias extending through the first dielectric layer.

18. The method of claim 15 further comprising forming a plurality of conductive traces on the second side of the first dielectric layer of the core, wherein the plurality of conductive traces formed on the first side of the first dielectric layer of the core are coupled to a ground voltage for the integrated circuit package and the plurality of conductive traces formed on the second side of the first dielectric layer of the core are coupled to a supply voltage for the integrated circuit package.

19. The method of claim 15 further comprising forming a thin dielectric layer over the first dielectric layer and a plurality of contacts on the thin dielectric layer.

20. The method of claim 19 further comprising attaching a die to the plurality of contacts on the thin dielectric layer.

* * * * *